United States Patent [19]

Win et al.

[11] Patent Number: 4,914,322

[45] Date of Patent: Apr. 3, 1990

[54] POLARITY OPTION CONTROL LOGIC FOR USE WITH A REGISTER OF A PROGRAMMABLE LOGIC ARRAY MACROCELL

[75] Inventors: Vincent K. Z. Win, Milpitas; Andrew K. Chan, Palo Alto, both of Calif.

[73] Assignee: Advanced Micro Devices, Inc., Sunnyvale, Calif.

[21] Appl. No.: 285,721

[22] Filed: Dec. 16, 1988

[51] Int. Cl.$^4$ .......................................... H03K 19/177
[52] U.S. Cl. .................................... 307/465; 307/236; 307/469; 307/481
[58] Field of Search ............................... 307/451–453, 307/465, 468, 469, 481, 236, 272.3; 364/716

[56] References Cited

U.S. PATENT DOCUMENTS

| | | | |
|---|---|---|---|
| 4,612,459 | 9/1986 | Pollachek | 307/468 |
| 4,638,183 | 1/1987 | Rickard et al. | 307/468 X |
| 4,638,189 | 1/1987 | Geannopoulos et al. | 307/465 |
| 4,677,318 | 6/1987 | Veenstra | 307/465 |
| 4,684,830 | 8/1987 | Tsui et al. | 307/465 |
| 4,758,746 | 7/1988 | Birkner et al. | 307/465 |
| 4,761,570 | 8/1988 | Williams | 364/716 X |
| 4,771,285 | 9/1988 | Agrawal et al. | 307/465 X |
| 4,783,606 | 11/1988 | Goetting | 307/468 X |
| 4,789,951 | 12/1988 | Birkner et al. | 307/465 X |

OTHER PUBLICATIONS

Barish et al., "Polarity Hold Latch in a Shift Register Latch to Decrease the Minimum Pulse Width for Test Cycle Time", *IBM T.D.B.*, vol. 20, No. 3, Aug. 1977, pp. 1025–1026.

Primary Examiner—David Hudspeth

[57] ABSTRACT

Polarity option control logic is disclosed which provides an optimized design for a macrocell of a programmable logic array with a minimal parts count.

The invention is designed for use with a register of the macrocell having first and second input paths, the first input path including an inverter, and first and second switches in each path respectively. The polarity option control logic of the present invention includes a first logic circuit for receiving a clock input and a polarity input signal and controlling the activation of the first switch in response thereto and a second logic circuit for receiving the clock input and an inverted polarity input signal and controlling the activation of the second switch in response thereto. When the polarity input signal is in a first state, the first input path is enabled via the first switch in accordance with the clock signal and when the polarity input signal is in a second state, the second input path is enabled via the second switch in accordance with the clock signal.

In a particular embodiment, a macrocell is provided including polarity option control logic, a bypass option, a high speed multiplexer and an advantageous preload circuit that minimizes parasitic capacitances at the register input. Thus, a macrocell constructed in accordance with the present teachings, can be configured in a register mode with set, reset and preload features or a logic mode with an optimized speed path for both modes of operation.

4 Claims, 3 Drawing Sheets

POLARITY OPTION CONTROL LOGIC FOR USE WITH A REGISTER OF A PROGRAMMABLE LOGIC ARRAY MACROCELL

BACKGROUND OF THE INVENTION

1. Field of the Invention

The present invention relates to programmable logic arrays (PLAs). More specifically, the present invention relates to macrocells for programmable array logic circuits (PALs).

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Programmable logic arrays provide 'glue logic' for PC (printed circuit) boards. Glue logic is the logic required to interface two boards and generally includes a plurality of AND gates, OR gates and input/output I/O buffers. PLAs consume less space and therefore generally provide glue logic in a less costly manner than individual AND gates, OR gates and I/O buffers.

PLAs also offer the advantage of reconfigurability over discrete or individual gates. That is, PLAs generally include an array of 'AND' gates, an array of 'OR' gates, and some provision for interconnecting the outputs of selected AND gates to the inputs of selected OR gates. PLAs allow a wide variety of logic functions to be implemented through the combination, via the OR gates, of the product terms, provided by the AND gates. Further, the configuration of the array may be quickly, easily and relatively inexpensively reprogrammed to implement other functions.

As described in U.S. Pat. No. 4,124,899, programmable array logic circuits were developed to provide further improvements in the speed, space requirements, cost and power consumption of PLAs. In a most general sense, a PAL provides a field programmable logic array in which a programmable array of circuit inputs are provided to a plurality of AND gates to generate product terms. Outputs from subgroups of AND gates are, in turn, nonprogrammably connected as inputs to individual, specified OR gates to provide the sum of products. Hence, PALs provide programmable AND and fixed OR functions relative to generic PLAs.

More specifically, a typical PAL includes a plurality of input and output pads which are essentially connection areas and which facilitate the bonding of a first circuit to another circuit via the 'glue logic' provided by the PAL. Each input pad is connected to an input buffer which includes circuitry for detecting address transitions at a corresponding input pad. Each input buffer is connected to the logic array. The logic array provides programmable AND and fixed OR product terms to a set of sense amplifiers. The sense amplifiers detect state changes in the array and provide the array outputs to a plurality of latch blocks. The latch blocks are each connected to a macrocell. The macrocells provide register functions (enable control, D flip-flop, set and reset control and etc.), other output functions, information and state control to an associated output pad.

There is an ongoing effort in the art to reduce the parts count, simplify the design and the reduce the power consumption of PALs.

SUMMARY OF THE INVENTION

The need in the art is addressed by polarity option control logic of the present invention which provides an optimized design for a macrocell with a minimal parts count.

The invention is designed for use with a register of the macrocell having first and second input paths, the first input path including an inverter, and first and second switches in each path respectively. The polarity option control logic of the present invention includes a first logic circuit for receiving a clock input and a polarity input signal and controlling the activation of the first switch in response thereto and a second logic circuit for receiving the clock input and an inverted polarity input signal and controlling the activation of the second switch in response thereto.

When the polarity input signal is in a first state, the first input path is enabled via the first switch in accordance with the clock signal and when the polarity input signal is in a second state, the second input path is enabled via the second switch in accordance with the clock signal.

In a particular embodiment, a macrocell is provided including polarity option control logic, a bypass option, a high speed multiplexer and an advantageous preload circuit that minimizes parasitic capacitances at the register input. Thus, a macrocell constructed in accordance with the present teachings can be configured in a register mode with set, reset and preload features or a logic mode with an optimized speed path for both modes of operation.

DESCRIPTION OF THE INVENTION

Figure 1:
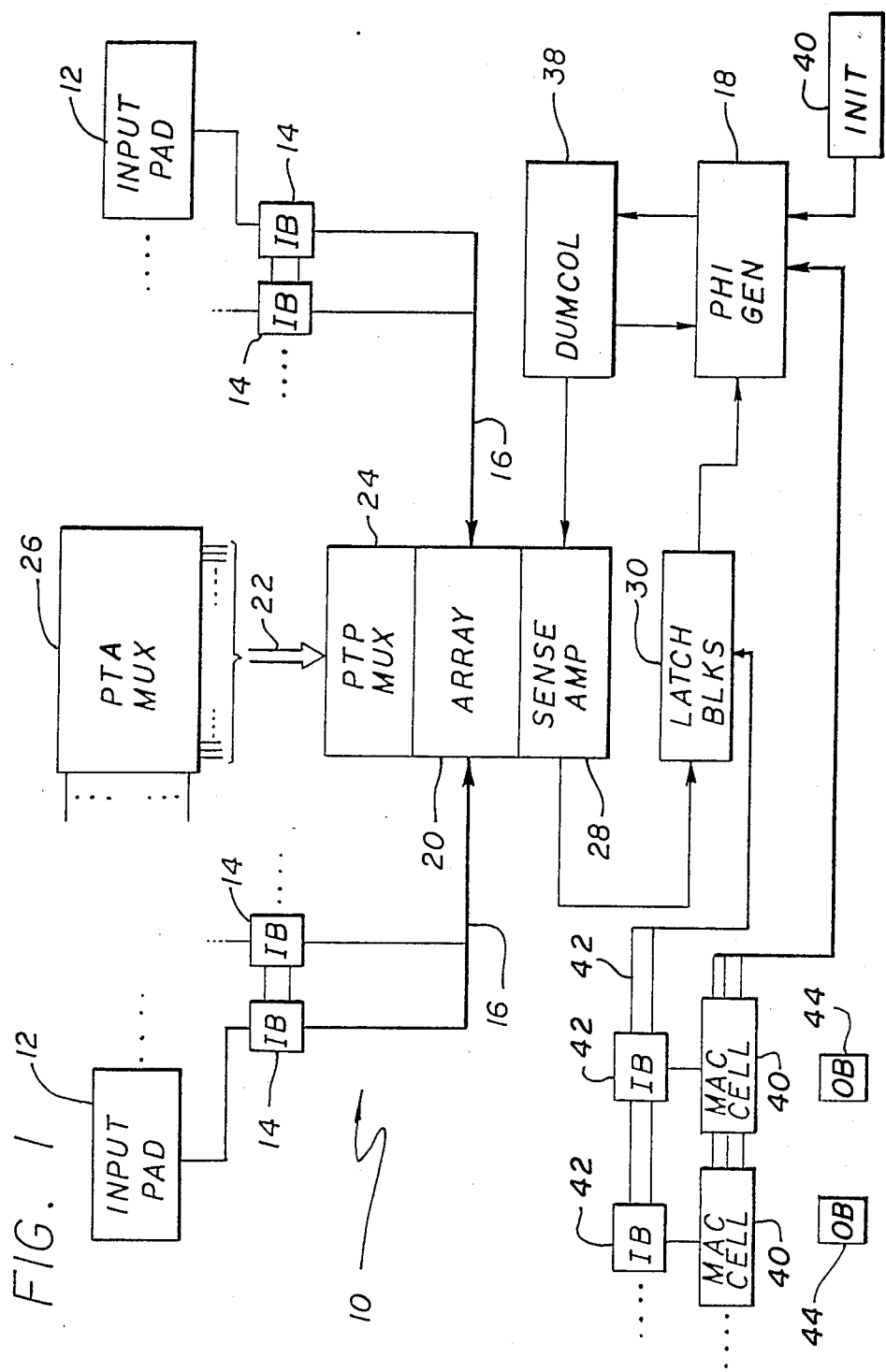
FIG. 1 is a simplified block diagram of an illustrative programmable array logic system.

FIG. 1 is a simplified block diagram of an illustrative programmable array logic (PAL) system 10. As is generally known in the art, the PAL 10 is a programmable logic array of a particularly advantageous design providing 'glue logic' for circuit interconnection at high speed with minimal power consumption. The PAL 10 includes a plurality of input pads 12 which are typically probe pads with electrostatic protection circuitry (not shown). The input pads 12 facilitate the bonding of a first circuit to another circuit via the 'glue logic' provided by the PAL 10. Each input pad 12 is connected to an input buffer (IB) 14. Each input buffer 14 includes circuitry for detecting address transitions at a corresponding input pad 12. Each input buffer 14 is connected to a bus 16 and a phi generator 18 called transition detect signal (TDS) bus (not shown). The bus 16 communicates with an array 20. The array 20 typically provides an electrically erasable (E2) cell array of AND gates (not shown). As is known in the art, each input of each AND gate of the array 20 may be programmably interconnected to a selected line of an input data bus 16. A set of sense amplifiers 28 are connected to the array 20. The sense amplifiers 28 are connected to a plurality of latching circuits or latch blocks 30, one for each output of the array 20. The latch blocks 30 are each connected to a macrocell 40 each of which, in turn, may be connected to one or more of a plurality of output pads 42. The output pads 42 are connection areas and may double as input pads when data is propagated in a reverse direction through the PAL 10 via the input buffers 44.

Figure 2:
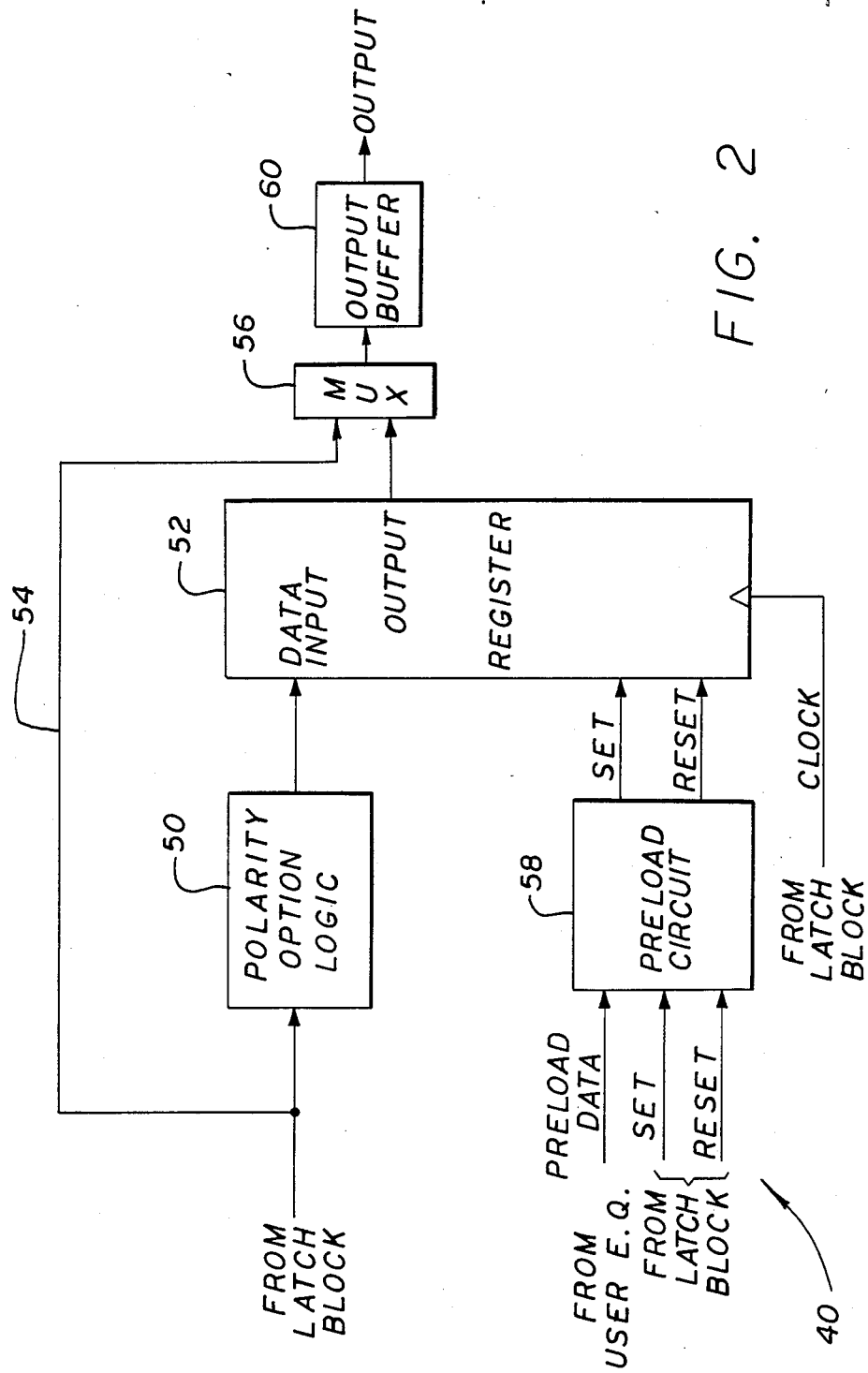
FIG. 2 is a block diagram of a macrocell constructed in accordance with the teachings of the present invention.

As mentioned above, the present invention provides an optimized design for a macrocell with a minimal parts count. The illustrative embodiment of FIG. 2 shows a simplified block diagram of the macrocell 40, incorporating the present teachings, including polarity option control logic 50 for a register 52, a bypass option provided by a bypass path 54 and a high speed multiplexer 56 and an advantageous preload circuit 58 that minimizes parasitic capacitances at the input to the register 52. The output of the macrocell 40 is provided through a conventional output buffer 42.

Polarity option control logic 50 allows the user to control the polarity of the outputs of the array 20 (the data inputs for the macrocell 40) by programming an appropriate cell of the array 20 to provide the polarity control signal. When a polarity change is programmed, the cell signals the macrocell 40 to change the polarity of the array output. This function is typically provided by a separate polarity option control circuit which splits the macrocell input into two complementary paths (one including an inverter), each of which includes a switch operable under the control of the polarity cell of the array 20. While this arrangement has been found to be satisfactory for most applications, the present invention provides an alternative which allows for optimized performance with minimal parts count. The polarity option control technique of the present invention includes logic 50 which uses the polarity option signal from the array 20 along with a clock signal to control switches, which are part of the register 52 of the macrocell 40, to provide the polarity option. The approach of the present invention saves space 'real estate' on the PAL chip and may increase the speed of operation of the system.

Figure 3:
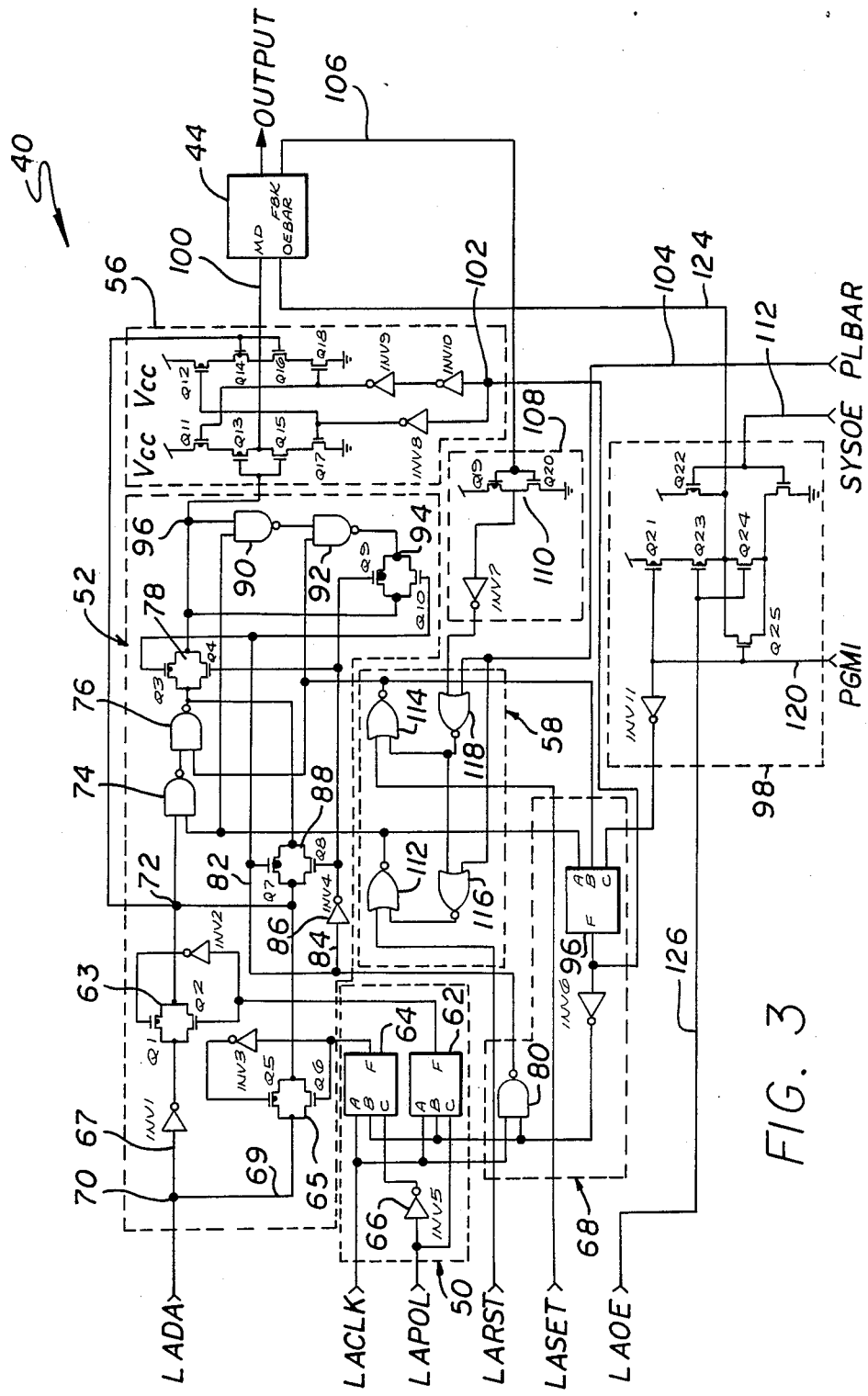
FIG. 3 is a schematic diagram of an illustrative embodiment of a macrocell constructed in accordance with the teachings of the present invention.

The polarity option control logic 50 of the present invention is presented in the illustrative schematic diagram of a macrocell 40 of FIG. 3. The polarity option control logic circuit 50 of he present invention includes first and second AND/OR/INVERT (AOI) circuits 62 and 64 having clock inputs 'LACLK' as A inputs, bypass inputs as B inputs, and polarity inputs 'LAPOL' as C inputs. The clock and polarity inputs LACLK and LAPOL are provided by the latch blocks 30 while the bypass inputs are provided by a bypass logic circuit 68. The polarity input to the second AOI circuit 64 is inverted by the inverter 66. Thus, the outputs F of the first and second AOI circuits are complementary and related to the inputs by the following relation:

$$F = (AB + C)'  \quad [1]$$

AOI circuits are well known in the art. Further, the invention is not limited to the use of AOI circuits. The function of the AOI circuits may be provided by other logic circuits without departing from the scope of the present invention.

The first and second AOI circuits 62 and 64 are connected to switches 63 and 65, disposed in first and second complementary input paths 67 and 69, respectively, between first and second nodes 70 and 72 in the register circuit 52. The paths are complementary by virtue of the inverter INV1 in the first path 67. Each switch 63 and 65 includes complementary CMOS transistors Q1/Q2 and Q5/Q6 respectively. Transistors Q1 and Q5 are p-channel transistors while transistors Q2 and Q6 are n-channel transistors. All transistors are field effect transistors unless otherwise specified. The inputs to the p-channel transistors Q1 and Q5 are inverted by inverters INV2 and INV3, respectively, and the inputs to the inverters INV2 and INV3 are tied to the inputs to the n-channel transistors Q2 and Q6, respectively, so that both CMOS transistors in a switch are either 'on' together or 'off' together. The sources and drains of each CMOS transistor in each switch are tied together to provide a common source and a common drain and the respective inputs and outputs of each switch. The input of the first switch 63 is connected to the output of the inverter INV1. The input of the inverter INV1 is connected to the first node 70 in the register 52. The output of the first switch 63 is connected to the second node 72 in the register 52. The input of the second switch 65 is connected to the first node 70 in the register 52. The output of the second switch 65 is connected to the second node 72 in the register 52. Whenever either switch 63 or 65 is activated by the corresponding AOI circuit 62 or 64, respectively, the corresponding path 67 or 69, respectively, is enabled and data from the corresponding latch block 30 (not shown) is passed thereby to the second node 72 of the register 52. As mentioned above, the outputs F of the first and second AOI circuits are complementary. Thus, the switches 63 and 65 are activated alternately so that only one path 67 or 69 is enabled at a time.

The bypass path 54 is connected between the second node 72 and an input to the high speed multiplexer 56. The second node 72 also provides a first input to a first NAND gate 74 of a first latch of the register 52. The first latch also includes a second NAND gate 76 and a third CMOS switch 78. As discussed more fully below, the second input to the first NAND gate 74 of the first latch is a register reset signal 'LARST' provided from corresponding latch block 30 (not shown) through the preload circuit 58. The output of the first NAND gate 74 is a first input to the second NAND gate 76. As discussed more fully below, the second input to the second NAND gate 76 of the first latch is a register set signal 'LASET' provided from corresponding latch block 30 (not shown) through the preload circuit 58. The output of the second NAND gate 76 is connected to the input to the third switch 78. The third switch 78 operates in a manner similar to that of the first and second switches 63 and 65 under control of a signal from a NAND gate 80 in the bypass logic circuit 68 via the third and fourth paths 84 and 86 and the inverter 86 in the fourth path 86. Whenever the third switch 78 is activated, a fourth CMOS switch 88 is activated which operates in a manner similar to that of the first and second switches 63 and 65 under control of a signal from a NAND gate 80 in the bypass logic circuit 68 via the third and fourth paths 84 and 86 and the inverter 86 in the fourth path 86. The operation of the fourth switch is effective to feed the output of the second NAND gate 76 to the input of the first NAND gate 74 at the second node 72 to complete the first latch.

When the third switch 78 is activated, the output of the first latch is passed on as a first input to a third NAND gate 90 (which is part of a second latch of the register 52) and serves as an output from the register 52 and an input to the high speed multiplexer 56 at a third node 96.

The second latch also includes a fourth NAND gate 92 and a fifth CMOS switch 94. As discussed more fully below, the second input to the third NAND gate 90 of the first latch is a register reset signal 'LARST' provided from corresponding latch block 30 (not shown) through the preload circuit 58. The output of the third NAND gate 90 is a first input to the fourth NAND gate 92. As discussed more fully below, the second input to the fourth NAND gate 92 of the second latch is a register set signal 'LASET' provided from corresponding latch block 30 (not shown) through the preload circuit 58. The output of the fourth NAND gate 92 is connected to the input to the fifth switch 94. The fifth switch 94 operates in a manner similar to that of the first and second switches 63 and 65 under control of a signal from a NAND gate 80 in the bypass logic circuit 68 via the third and fourth paths 84 and 86 and the inverter 86 in the fourth path 86. Note, that the gate of the p-channel transistor Q9 of the fifth switch 94 is connected to the gate of the n-channel transistor Q4 of the third switch 78 and the gate of the n-channel transistor Q10 of the fifth switch 94 is connected to the gate of the p-channel transistor Q3 of the third switch 78. Thus, whenever the third switch 78 is activated, the fifth switch 94 is deactivated. The operation of the fifth switch 94 is effective to feed the output of the fourth NAND gate 92 to the input of the third NAND gate 90 at the third node 96 to complete the second latch.

The high speed multiplexer 56 is a unique and advantageous design including eight transistors Q11–Q18 and three inverters INV8–INV10. Transistors Q11–Q14 are p-channel transistors while transistors Q15–Q18 are n-channel transistors. Transistors Q11, Q12, Q17 and Q18 provide power for the multiplexer 56 under the influence of the inverter INV8 and the buffer provided by the inverters INV9 and INV10. Enable control for the multiplexer 56 is provided by an output from an OR/AND/INVERT (OAI) circuit 96 in the bypass logic circuit 68. As discussed more fully below, the OAI circuit 96 receives inputs from the preload circuit 58 and an output enable control circuit 98.

The drains of transistors Q11 and Q12 of the multiplexer 56 are connected to a source of electrical potential $V_{cc}$. The source of transistor Q11 is connected to the drain of transistor Q13. The source of transistor Q12 is connected to the drain of transistor Q14. The sources of transistors Q13 and Q14 and the drains of transistors Q15 and Q16 are connected to the output line 100 of the multiplexer 56. The sources of transistors Q15 and Q17 are connected to the drains of transistors Q17 and Q18 respectively. The sources of transistors Q17 and Q18 are connected to a common ground termination. The gates of transistors Q12 and Q17 are connected to the output of the inverter INV8. The gates of transistors Q11 and Q18 are connected to the output of the inverter INV9.

One data input to the multiplexer 56 is provided by the complementary arrangement of transistors Q13 and Q15. A second data input is provided by the complementary arrangement of transistors Q14 and Q16. That is, the gates of the paired transistors Q13 and Q15 are connected to the output of the register 52 to provide one input terminal and the gates of the paired transistors Q14 and Q16 are connected to the bypass line 54 to provide the second input terminal.

When the signal on the multiplexer enable control line 102 is low, the output of the inverter INV8 will be high, turning off transistor Q12 and turning on transistor Q17, and the output of the inverter INV9 will be low, turning on transistor Q11 and turning off transistor Q18. When the signal on the enable control line 102 is high, the output of the inverter INV8 will be low, turning on transistor Q12 and turning off transistor Q17, and the output of inverter INV9 will be high turning off transistor Q11 and turning on transistor Q18. Thus, transistors Q11 and Q17 operate in unison and transistors Q12 and Q18 operate in unison and alternately with respect to transistors Q11 and Q17. Hence, one and only one data input path is enabled at a time. For example, when Q11 and Q17 are on, Q12 and Q18 are off and the output on line 100 will depend on the output of the register 52. If the output of the register 52 is high, transistor Q15 will be turned on, transistor Q13 will be off and the output of the multiplexer 56 will be pulled low by transistor Q15 and Q17. It is readily seen that if the output of the register 52 is low, transistor Q13 will be on, transistor Q15 will be off and the output of the multiplexer 56 will be high. Similarly, when the second data input is enabled, the output of the multiplexer 56 will depend on the signal on the bypass line 54. Thus, the multiplexer 56 switches between the output of the register 52 and the bypass line 54 in response to the signal on the control line 102. The output of the multiplexer 56 is provided to a conventional output buffer 42 and ultimately to an output pad 44.

Those skilled in the art will appreciate the advantageous design of the multiplexer 56 of the present invention. That is, one advantageous feature of the present multiplexer 56 is the provision of the inputs to the multiplexer 56 via transistor gates, not source and drain terminals as with conventional pass gate and transmission gate type multiplexers.

The preload circuit 58 includes four NOR gates 112, 114, 116, and 118 and serves to preload the register 52 with preload data from the output buffer 44 by manipulating the set and reset signals LASET AND LARST respectively. A preload enable control signal PLBAR is provided as a first input to the fourth NOR gate 118 on line 104. A second input to the fourth NOR gate 118 is provided by line 106 from the output buffer 44 on line 106. This is preload data from memory (not shown) within the output buffer 44. The preload data is buffered by the buffer circuit 108 which includes first and second inverters 110 and INV7. The first inverter 110 is provided by the CMOS pair of transistors Q19 and Q20. When the preload enable signal PLBAR on line 104 is low, the buffered preload data is passed by the fourth NOR gate 118 to the second and third NOR gates 114 and 116 respectively. Third NOR gate 116 receives the preload enable signal on line 104 and preload data from the fourth NOR gate 118. The third NOR gate 116 inverts the preload data and provides the inverted preload data to the first NOR gate 112. The second input to the first NOR gate 112 is the reset signal LARST. The inputs to the second NOR gate 114 are the preload data from the fourth NOR gate 118 and the set signal LASET. As mentioned above, the output of the first NOR gate 112 is input to the first NAND gates 74 and 90 of the first and second latches of the register 52 and is the A input to the OAI circuit 96 of the bypass logic circuit 68. The output of the second NOR gate 114 is input to the second NAND gates 76 and 92 of the first and second latches of the register 52 and is the B input to the OAI circuit 96 of the bypass logic circuit 68. Thus, during preload, the first and second latches of the register 52 are set by with preload data by the preload circuit 58. Thereafter, the first and second latches of the register 52 are set by the set and reset signals LASET and LARST from the corresponding latch block 30 of FIG. 1.

Those skilled in the art will appreciate the advantageous design and operation of the preload circuit 58 of the present invention in that it provides for the preloading of the register 52 without requiring a connection to the input of the register at the data input terminal node 70 as is typical of conventional preload schemes. This minimizes capacitance on the input node 70 and allows for greater speed in operation.

The bypass logic circuit 68 provides for the selective bypassing of the register 52 when the system 10 is in the programming mode during which clock signals are not available for the register 52. The bypass logic circuit includes the OAI circuit 96, an inverter INV6, and the NAND gate 80. The inputs to the OAI circuit 96 are provided by the outputs of the first and second NOR gates 112 and 114 and the output of the enable control circuit 98. The output enable control circuit 98 receives the normally low programming signal PGM1 on line 120 and the system output enable signal SYSOE on line 122 and an output enable signal LAOE on line 126 from the corresponding latch block 30 of FIG. 1. The output enable control circuit 98 includes six transistors Q21–Q26 and an inverter INV11. Transistors Q21–Q23 are p-channel transistors and transistors Q25–Q26 are n-channel transistors. The system enable signal SYSOE is received at the gates of transistors Q22 and Q26. The drain of Q22 is connected to $V_{cc}$. The source of Q22 is connected to the output buffer enable control line OEBAR 124 of the output buffer 44. Thus, whenever, the system output enable signal SYSOE on line 122 goes low, a high is placed on the output buffer enable control line 124 enabling the output buffer 44. When the signal SYSOE on the system enable line 122 goes high, transistors Q21–Q25 are enabled by transistor Q26. The drain of Q21 is connected to $V_{cc}$, the gate is connected to the programming line 120 and the source is connected to the drain of Q23. The gate of Q23 is connected to the latch enable control line 126 and the source of Q23 is connected to the output buffer enable control line 124. The gate of Q24 is also connected to the latch enable control line 126. The drain of Q24 is connected to the output buffer enable control line 124. The source of Q24 is connected to the drain of Q26. The source and drain of transistor Q25 is connected in parallel with the source and drain of transistor Q24. The gate of Q25 and the input of the inverter INV11 are connected the programming line 120.

When the system enable signal SYSOE is high and the programming signal on line 120 is high, a low is placed on the output buffer enable control line 124 by transistors Q25 and Q26 disabling the output buffer 44 and a low is provided at the C input of the OAI circuit 96. When the system enable signal SYSOE is high and the programming signal on line 120 is low, the C input to the OAI circuit 96 is high, Q21 is turned on and the output buffer enable is under the control of the LAOE signal on line 126 from the latch block 30 of FIG. 1 through Q23 and Q24. That is, if LAOE is low, Q23 turns on and the output buffer 44 is enabled. If LAOE is high, Q24 turns on and the output buffer 44 is disabled.

Returning to the bypass logic circuit 68, the C input to the OAI circuit 96 is basically the inverted programming signal PGM1 on line 120. The output F of the OAI circuit 96 is given by the relation below:

$$F=[(A+B)C]' \qquad [2]$$

OAI circuits are well known in the art. Further, the invention is not limited to the use of OAI circuits. The function of the OAI circuits may be provided by other logic circuits without departing from the scope of the present invention.

Thus, in normal operation, when the programming signal PGM1 is low, the output F of the OAI circuit 96 will depend on the set and reset signals LASET and LARST and the preload data. The output of the OAI circuit 96 is used to control the multiplexer 56 as mentioned above. The output of the OAI circuit 96 is also inverted and input to the NAND gate 80 and the first and second AOI circuits 62 and 64 at the B inputs thereof.

Thus, in the programming mode, when the output F of the OAI circuit 96 is high, the multiplexer 56 is in a bypass mode passing the data on the bypass line 54 to the output buffer 44. The output of the NAND gate 80 is high and the clock is disabled from the first and second latches of the register 52. At the same time, the B inputs to the first and second AOI circuits 62 and 64 are low and one of the switches are activated in accordance with the state of the polarity signal LAPOL. This permits the verification of the program stored in the array 20 without interference by the register 52. In the normal mode of operation, the output F of the OAI circuit 96 will depend on the set and reset signals. That is, if F is low, the input to the NAND gate 80 is high and the clock is passed on to the first and second latches of the register 52. At the same time, the B inputs of the AOI circuits 62 and 64 are high and these circuits are enabled for normal operation with the clock and polarity signals LACLK and LAPOL controlling operation of switches 63 and 65.

Thus, the macrocell 40 constructed in accordance with the present teachings can be configured in a register mode with set, reset and preload features or a logic mode with an optimized speed path for both modes of operation.

Thus, the present invention has been described herein with reference to a particular embodiment for a particular application. Those of ordinary skill in the art will recognize additional modifications applications and embodiments within the scope of the present invention. It is therefore intended by the appended claims to cover any and all such applications, modifications and embodiments.

Accordingly,

What is claimed is:

1. In a macrocell having a register with first and second input paths, said first input path including an inverter, and first and second switches in each path respectively, polarity option control logic comprising:
first logic means for receiving a clock input and a polarity input signal and controlling the activation of said first switch in response thereto and
second logic means for receiving said clock input and said polarity input signal inverted and controlling the activation of said second switch in response thereto;

whereby when said polarity input signal is in a first state, said first input path is enabled via said first switch in accordance with said clock signal and when said polarity input signal is in a second state, said second input path is enabled via said second switch in accordance with said clock signal.

2. The invention of claim 1 wherein said first logic means includes an AND/OR/INVERT circuit having said clock signal as a first input and said polarity signal as a second input and having an output terminal connected to a control terminal of said first switch.

3. The invention of claim 2 wherein said second logic means includes an AND/OR/INVERT circuit having said clock signal as a fist input and said inverted polarity signal as a second input and having an output terminal connected to a control terminal of said second switch.

4. The invention of claim 3 including an inverter having said polarity signal as an input and being connected to said second input of said second AND/OR/INVERT circuit.

* * * * *